United States Patent
Ma

(10) Patent No.: US 7,961,030 B2
(45) Date of Patent: Jun. 14, 2011

(54) TIMING CONTROL APPARATUS

(75) Inventor: Chin-Shiang Ma, Taipei Hsien (TW)

(73) Assignee: Wistron Corp., Hsichih, Taipei Hsien (TW)

( * ) Notice: Subject to any disclaimer, the term of this patent is extended or adjusted under 35 U.S.C. 154(b) by 86 days.

(21) Appl. No.: 12/255,820

(22) Filed: Oct. 22, 2008

(65) Prior Publication Data

US 2009/0237141 A1 Sep. 24, 2009

(30) Foreign Application Priority Data

Mar. 18, 2008 (TW) .............................. 97109524 A

(51) Int. Cl.
*H03K 17/296* (2006.01)

(52) U.S. Cl. ...................................................... 327/392

(58) Field of Classification Search .................. 327/142, 327/143, 198, 392
See application file for complete search history.

(56) References Cited

U.S. PATENT DOCUMENTS

| 5,081,374 | A * | 1/1992 | Davis .............................. 326/27 |
| 7,279,943 | B2 * | 10/2007 | Steinacker ..................... 327/143 |
| 7,403,051 | B1 * | 7/2008 | Lesea ............................ 327/143 |
| 2003/0222703 | A1* | 12/2003 | Ker et al. ....................... 327/379 |
| 2008/0309407 | A1* | 12/2008 | Nakamura et al. ............ 330/253 |

* cited by examiner

*Primary Examiner* — Lincoln Donovan
*Assistant Examiner* — Daniel Rojas
(74) *Attorney, Agent, or Firm* — Thomas, Kayden, Horstemeyer & Risley, LLP

(57) ABSTRACT

The present invention discloses a timing control apparatus to control the on/off timing of the voltage sources. The timing control apparatus includes a plurality of delay circuits coupling with the voltage sources, a plurality of discharging circuits coupling with the delay circuits and a plurality of switches coupling with the discharging circuits.

15 Claims, 4 Drawing Sheets

US 7,961,030 B2

TIMING CONTROL APPARATUS

RELATED APPLICATIONS

This application claims priority to Taiwan Application Serial Number 97109524, filed Mar. 18, 2008, which is herein incorporated by reference.

FIELD OF THE INVENTION

The present invention relates to a control apparatus, and especially to a timing control apparatus.

BACKGROUND OF THE INVENTION

Multi-power supply system design is now the main trend. Such designs use many voltage sources integrated into a single Multi-power supply system. Therefore, a single power supply can simultaneously supply different voltages to different function circuits. For example, when a function circuit of an apparatus needs a low voltage level to work, the low voltage power source on the multi-power power supply is connected to the function circuit by the multi-power supply system. On the other hand, when another function circuit of the apparatus needs a high voltage level to work, the low voltage power source on the multi-power power supply is connected to the function circuit. Therefore, the Multi-power power supply system can provide different voltage levels to different function circuits based on their work requirement, which can reduce power consumption.

However, to prevent different voltage sources from being simultaneously connected to the same circuit, the timing to turn on and turn off the voltage sources is very important. Typically, an application-specific integrated circuit (ASIC) controls the circuit. However, the ASIC is very expensive, which makes reducing the producing cost difficult. Therefore, an apparatus that can reduce the manufacturing cost and realize the timing control is needed.

SUMMARY OF THE INVENTION

Therefore, the main purpose of the present invention is to provide a timing control apparatus that can reduce the manufacturing cost and realize the timing control.

In accordance with the foregoing purpose, the present invention discloses a timing control apparatus to control the on/off timing of the voltage sources. The timing control apparatus includes a plurality of delay circuits coupled with the voltage sources, a plurality of discharging circuits coupled with the delay circuits and a plurality of switches coupled with the discharge circuits.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
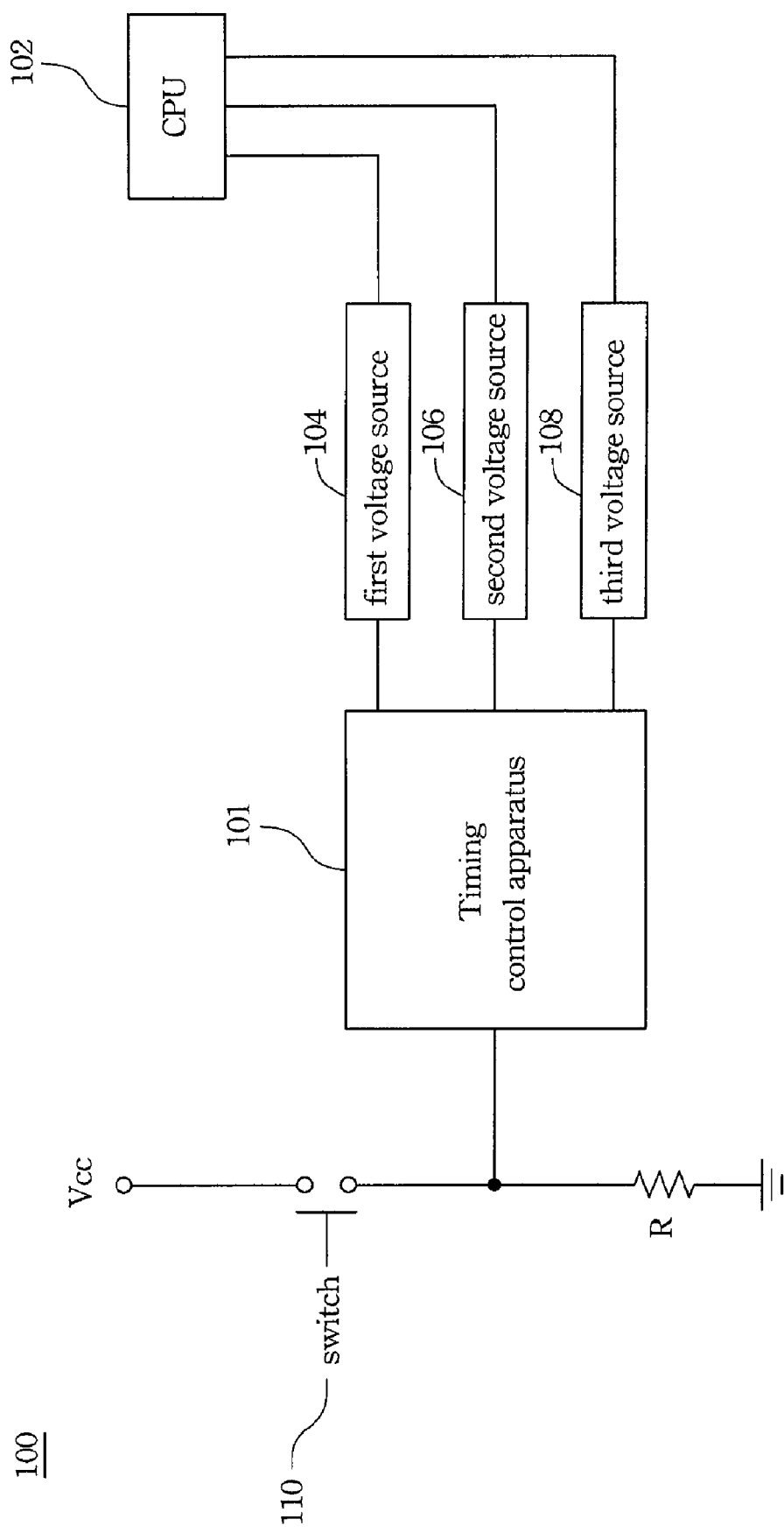
FIG. 1 is a schematic diagram of an electronic system with a timing control apparatus according to the first embodiment of the present invention.

FIG. 1 is a schematic diagram of an electronic system with a timing control apparatus according to the first embodiment of the present invention. The timing control apparatus 101 sequentially turns on or turns off the voltage sources of a central processing unit (CPU) 102. However, in other embodiments, the timing control apparatus 101 sequentially turns on or turns off the voltage sources of other electronic devices. Moreover, the voltage sources can supply the same voltage level or different voltage levels respectively.

According to an embodiment, the electronic system 100 includes a timing control apparatus 101, a central processing unit 102, a first voltage source 104, a second voltage source 106, a third voltage source 108 and a switch 110. The switch 110 switches the power Vcc. The timing control apparatus 101 controls the on/off timing of the first voltage source 104, the second voltage source 106 and the third voltage source 108 to provide voltage to the central processing unit 102 based on a specific timing.

Figure 2:
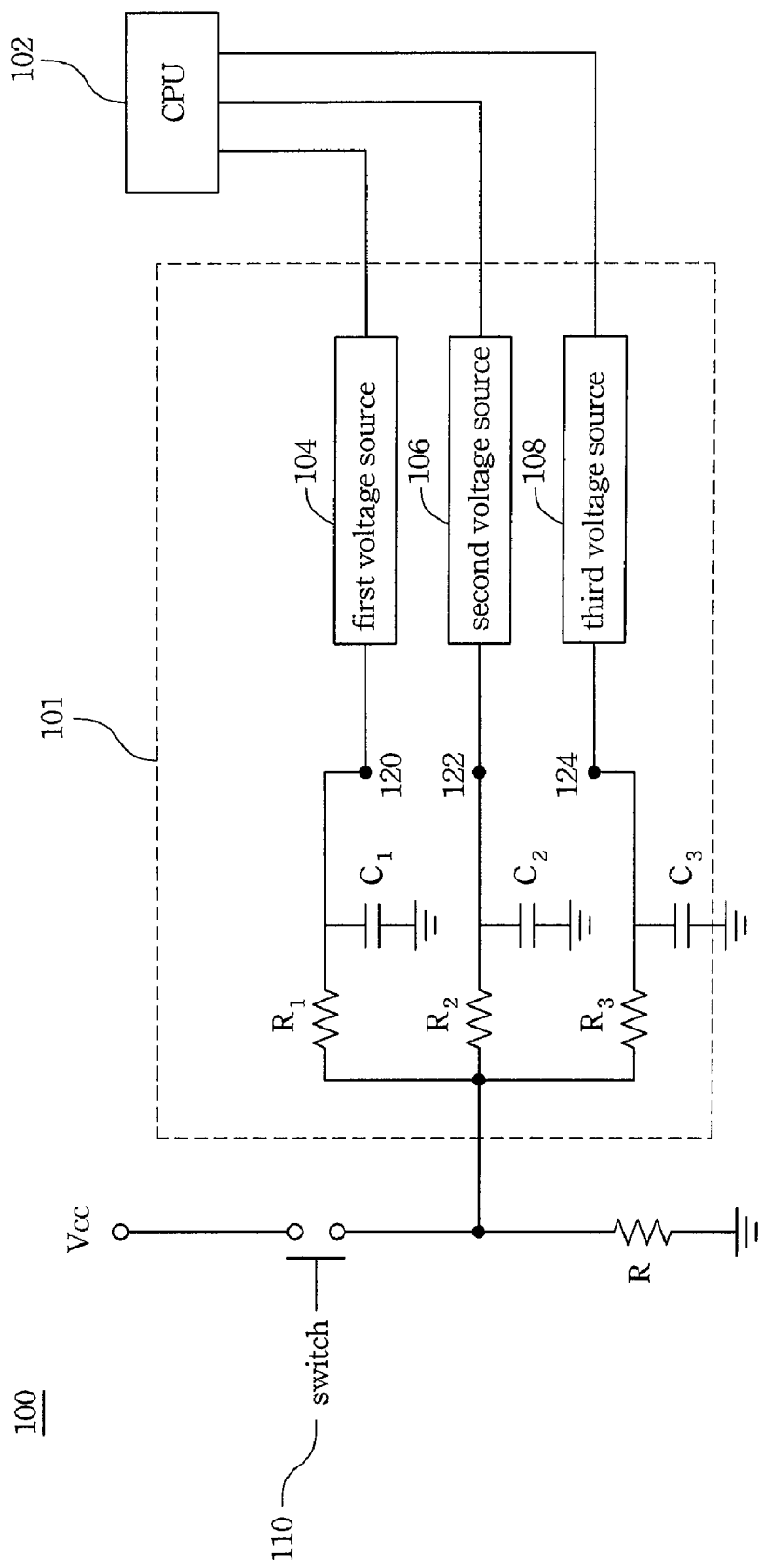
FIG. 2 is a detailed diagram of an electronic system with a timing control apparatus according to the first embodiment of the present invention.

FIG. 2 is a detailed diagram of an electronic system with a timing control apparatus according to the first embodiment of the present invention. In this embodiment, the timing control apparatus 101 includes three delay circuits coupled with the first voltage source 104, the second voltage source 106 and the third voltage source 108 respectively. Each delay circuit is composed of a resistor and a capacitor. Different resistances and capacitances provide different delay times. Therefore, the first voltage source 104, the second voltage source 106 and the third voltage source 108 can provide voltages to the central processing unit 102 based on a specific timing.

After the switch 110 connects the power Vcc to the system 100, the power Vcc charges the capacitors C1, C2 and C3 through the resistor R1, R2 and R3. The time for charging the capacitors C1, C2 and C3 can be adjusted by varying the resistance of the resistor R1, R2 and R3 and the capacitance of the capacitors C1, C2 and C3. Therefore, the three output terminals 120, 122 and 124 reach the voltage level for turning on the first voltage source 104, the second voltage source 106 and the third voltage source 108 respectively at different times. The first voltage source 104, the second voltage source 106 and the third voltage source 108 can provide voltages to the central processing unit 102.

On the other hand, after the switch 110 cuts off the connection between the power Vcc and the system 100, the capacitors C1, C2 and C3 are discharged through the resistor R1, R2 and R3. Therefore, the voltage levels of the three output terminals 120, 122 and 124 are dropped to turn off the first voltage source 104, the second voltage source 106 and the third voltage source 108 to supply power to the central processing unit 102. According to this embodiment, because of the natural character of the delay circuit, the timing for turning on the voltage sources 104, 106 and 108 and the timing for turning off the voltage sources 104, 106 and 108 are the same. That is that the voltage source that is turned on first will be turned off first. The voltage source that is turned on last will be turned off last.

Figure 3:
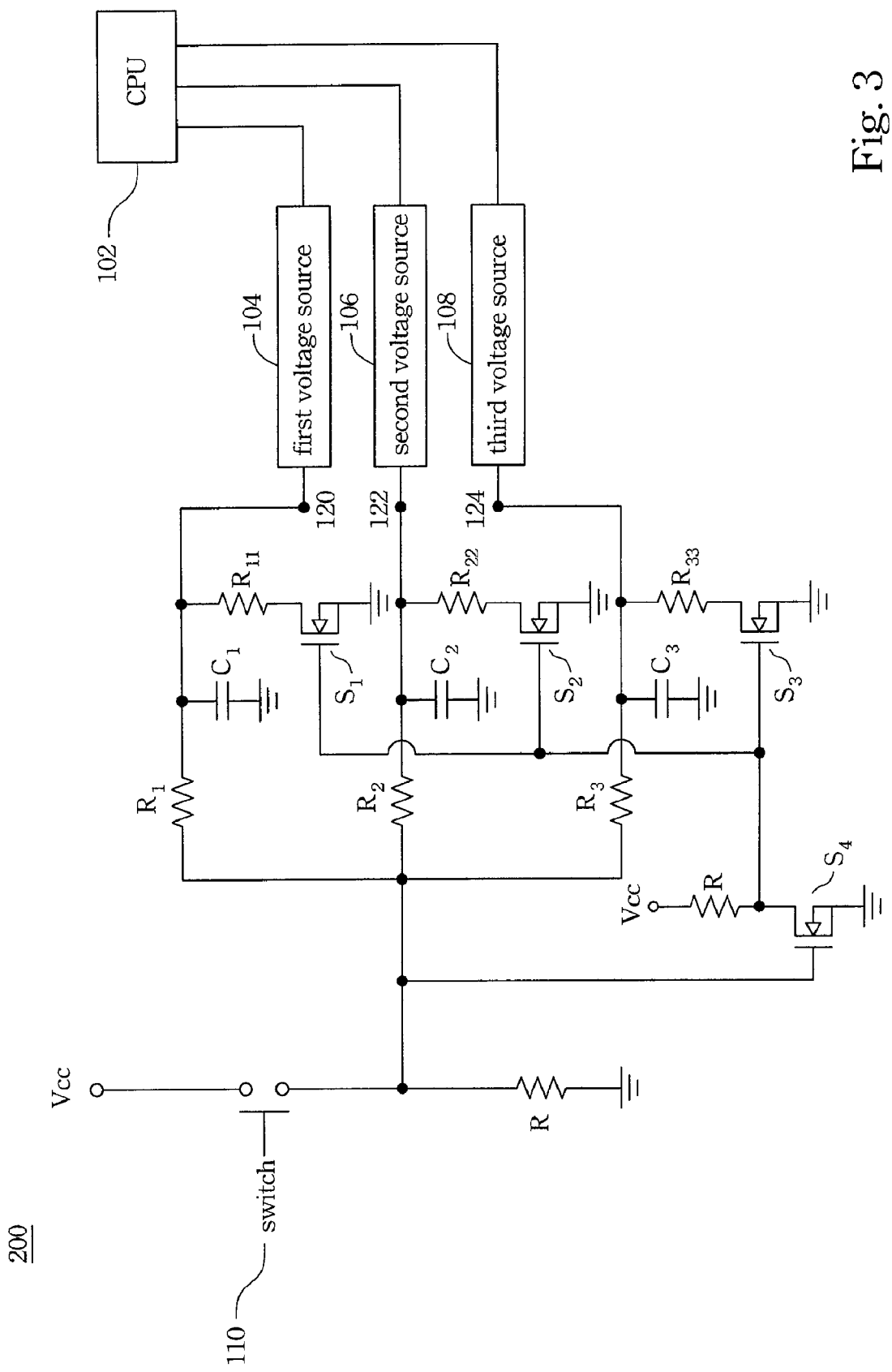
FIG. 3 is a schematic diagram of an electronic system with a timing control apparatus according to the second embodiment of the present invention.

FIG. 3 is a schematic diagram of an electronic system with a timing control apparatus according to the second embodiment of the present invention. According to the second embodiment, additional discharging routes controlled by switches are formed in the timing control apparatus to make the timing for turning on the voltage sources 104, 106 and 108 is different from the timing for turning off the voltage sources 104, 106 and 108. For example, an additional discharging route formed by a resistor R11 is connected to the delay circuit composed of resistor R1 and capacitor C1. A switch S1 controls this discharging route.

According to the second embodiment, after the power Vcc is connected to the system 200 by the switch 110, the switch S4 is turned on to ground the gate electrodes of the switches S1, S2 and S3. Therefore, the switches S1, S2 and S3 are turned off. These discharging routes controlled by the switches S1, S2 and S3 do not work. In this case, the power Vcc charges the capacitors C1, C2 and C3 through the resistor R1, R2 and R3. The time for charging the capacitors C1, C2 and C3 can be adjusted by varying the resistance of the resistor R1, R2 and R3 and the capacitance of the capacitors C1, C2 and C3. Therefore, the first voltage source 104, the second voltage source 106 and the third voltage source 108 can provide voltages to the central processing unit 102 based on a specific timing.

On the other hand, after the switch 110 cuts off the connection between the power Vcc and the system 200, the gate electrode of the switch S4 is grounded to cause the gate electrodes of the switches S1, S2 and S3 are connected to the power Vcc. Therefore, the switches S1, S2 and S3 are turned on. These discharging routes controlled by the switches S1, S2 and S3 can work. In this case, the capacitors C1 is discharged through the resistors R1 and R11. The capacitors C2 is discharged through the resistors R2 and R22. The capacitors C3 is discharged through the resistors R3 and R33. Therefore, the first voltage source 104, the second voltage source 106 and the third voltage source 108 can stop to provide voltages to the central processing unit 102 based on a specific timing. In this embodiment, the resistors R11, R22 and R33 are the additional discharging routes for the capacitors C1, C2 and C3 respectively. Therefore, the off timing of the first voltage source 104, the second voltage source 106 and the third voltage source 108 can be set by varying the resistance of the resistors R11, R22 and R33.

The equations for discharging and charging the delay circuits are shown in the following.

charging equation: $V=Vcc(1-\exp(-T/\tau)) \tau=RC$ discharging equation: $V=Vcc(\exp(-T/\tau)) \tau=RC$ V is the output voltage in the output terminal 120, 122 or 124. Vcc is the voltage of the power. C is the capacitance of the capacitor C1, C2 or C3. R is the resistance of the resistor connected with the capacitor C1, C2 or C3. For example, for the capacitor C1, R is the parallel connection resistance of the resistors R1 and R11. For the capacitor C2, R is the parallel connection resistance of the resistors R2 and R22. For the capacitor C3, R is the resistance of the resistors R3 and R33.

In one embodiment, when the V values in the output terminal 120, 122 and 124 are 0.5 Vcc, the delay time $T_{on}$ for turning on the first voltage source 104, the second voltage source 106 and the third voltage source 108 is shown in the following.

$T_{on}=0.69 \times R \times C$

In the case, the delay time $T_{off}$ for turning off the first voltage source 104, the second voltage source 106 and the third voltage source 108 is shown in the following.

$T_{off}=0.69 \times R \times C$

The delay time $T_{on}$ and $T_{off}$ can are obtained from the discharging and charging equations. According to this embodiment, the switches are MOS transistors. In other embodiments, the switches are controlled by different electrical potentials.

Figure 4:
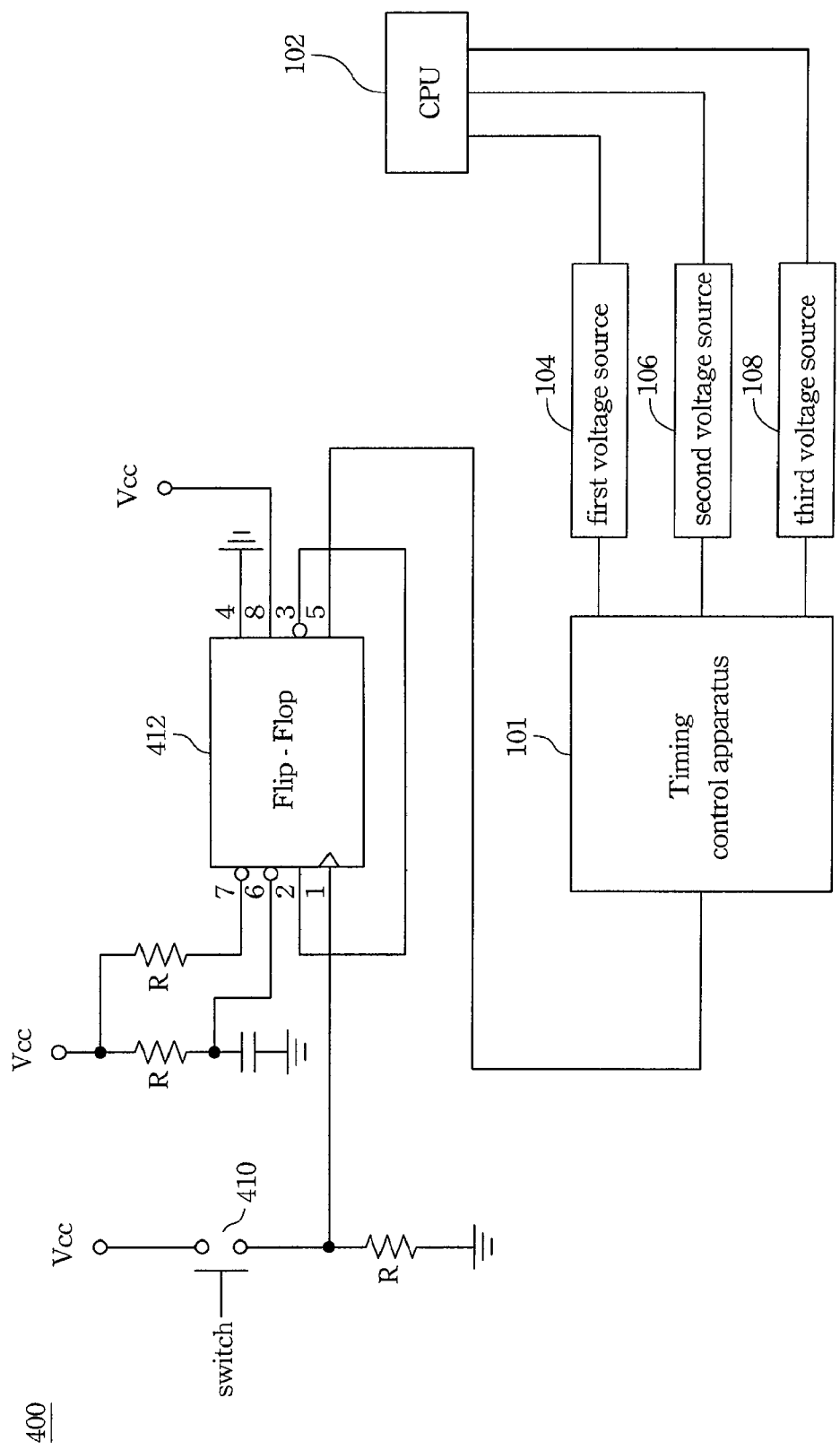
FIG. 4 is a schematic diagram of an electronic system with a timing control apparatus according to the third embodiment of the present invention.

FIG. 4 is a schematic diagram of an electronic system with a timing control apparatus according to the third embodiment of the present invention. The switch 410 of the system 400 is a pulse switch that outputs a pulse signal. In this embodiment, a Flip-Flop connects with the switch 410 to transform the pulse signal to a signal with fixed high level or low level. This signal is sent to the timing control apparatus 101.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A timing control apparatus, wherein the timing control apparatus connect to a power source through a first switch to generate a plurality of voltage sources to an electronic system, wherein the timing control apparatus controls the on/off timing of the voltage sources, comprising:
   a plurality of delay circuits coupling with the voltage sources respectively;
   a plurality of discharging circuits coupling with the delay circuits respectively, wherein each of the discharging circuits includes a second switch; and
   a third switch with a first end coupling with the power source and a second end coupling with a ground voltage, wherein after the first switch disconnects the timing control apparatus from the power source, the third switch is turned off to make the second switches be turned on by the power source to control the discharging circuits discharging the delay circuits respectively, and after the first switch connects the timing control apparatus to the power source, the third switch is turned on to make the second switches be turned off by the ground voltage to control the power source to charge the delay circuits respectively.

2. The timing control apparatus of claim 1, wherein the power source coupling with the voltage sources through the delay circuits.

3. The timing control apparatus of claim 1, wherein the first switch controls the connection between the power source and the delay circuits.

4. The timing control apparatus of claim 1, wherein each of the delay circuits includes a first resistor and a first capacitor in series, and each of the discharging circuits further includes a second resistor.

5. The timing control apparatus of claim 4, wherein a time for turning on each of the voltage sources is related to the resistance of the first resistor and the capacitance of the first capacitor.

6. The timing control apparatus of claim 4, wherein a time for turning off or turning on each of the voltage sources is related to the resistance of the first resistor, the resistance of the second resistor or the capacitance of the first capacitor.

7. The timing control apparatus of claim 1, wherein the first switch is a pulse switch that can output a pulse signal.

8. The timing control apparatus of claim 7, further comprising a flip-flop connects with the first switch and the delay circuits.

9. The timing control apparatus of claim 1, wherein the second switch is a MOS transistor.

10. A timing control apparatus, wherein the timing control apparatus connect to a power source through a first switch to generate a plurality of voltage sources to an electronic system, wherein the timing control apparatus controls the on/off timing of the voltage sources, comprising:
- a plurality of delay circuits, wherein the power source couples with the voltage sources through the delay circuits, wherein each of the delay circuits includes a first resistor and a first capacitor connection in series;
- a plurality of discharging circuits coupling with the delay circuits respectively, wherein each of the discharging circuits includes a second resistor and a second switch; and
- a third switch with a first end coupling with the power source and a second end coupling with a ground voltage, wherein after the first switch disconnects the timing control apparatus from the power source, the third switch is turned off to make the second switches be turned on by the power source to control the discharging circuits discharging the delay circuits respectively, and after the first switch connects the timing control apparatus to the power source, the third switch is turned on to make the second switches be turned off by the ground voltage to control the power source to charge the delay circuits respectively.

11. The timing control apparatus of claim 10, wherein the first switch controls the connection between the power source and the delay circuits.

12. The timing control apparatus of claim 10, wherein a time for turning on each of the voltage sources is related to the resistance of the first resistor and the capacitance of the first capacitor.

13. The timing control apparatus of claim 10, wherein a time for turning off or turning on each of the voltage sources is related to the resistance of the first resistor, the resistance of the second resistor or the capacitance of the first capacitor.

14. The timing control apparatus of claim 11, wherein the first switch is a pulse switch that can output a pulse signal.

15. The timing control apparatus of claim 14, further comprising a flip-flop connects with the first switch and the delay circuits.

* * * * *